US010568228B2

(12) United States Patent
Glander et al.

(10) Patent No.: US 10,568,228 B2
(45) Date of Patent: Feb. 18, 2020

(54) ADAPTER ASSEMBLY FOR FIELD CONTROLLER UNITS

(71) Applicant: Johnson Controls Technology Company, Auburn Hills, MI (US)

(72) Inventors: Michael Glander, Fredonia, WI (US); George Elliott Washington, Oak Creek, WI (US); Steven Anthony Gallo, Waukesha, WI (US); Minoru Suzuki, Milwaukee, WI (US); Matthew Forrest Malcolm, Brookfield, WI (US)

(73) Assignee: Johnson Controls Technology Company, Auburn Hills, MI (US)

( * ) Notice: Subject to any disclaimer, the term of this patent is extended or adjusted under 35 U.S.C. 154(b) by 0 days.

(21) Appl. No.: 15/995,745

(22) Filed: Jun. 1, 2018

(65) Prior Publication Data

US 2018/0352672 A1    Dec. 6, 2018

Related U.S. Application Data

(60) Provisional application No. 62/514,392, filed on Jun. 2, 2017.

(51) Int. Cl.
| H05K 7/14 | (2006.01) |
| H01R 12/00 | (2006.01) |
| F24F 11/70 | (2018.01) |

(52) U.S. Cl.
CPC ............ *H05K 7/1474* (2013.01); *F24F 11/70* (2018.01); *H01R 12/00* (2013.01)

(58) Field of Classification Search
CPC ..... H05K 7/1474; H05K 7/1468; F24F 11/70; H01R 12/00
See application file for complete search history.

(56) References Cited

U.S. PATENT DOCUMENTS 7,985,079 B1 *   7/2011   Wilson ................... H01R 12/52
                                                    439/74
9,017,103 B2 *   4/2015   Davis ................... H01R 12/716
                                                    439/607.1
(Continued)

FOREIGN PATENT DOCUMENTS

EP       1 383 368        1/2004
EP       1383368 A2 *     1/2004   .......... H05K 7/1472
(Continued)

OTHER PUBLICATIONS

Search Report for International Application No. PCT/US2018/035610, dated Jul. 30, 2018, 14 pages.

*Primary Examiner* — Jayprakash N Gandhi
*Assistant Examiner* — Hung Q Dang
(74) *Attorney, Agent, or Firm* — Foley & Lardner LLP

(57) ABSTRACT

A field controller adapter includes a bracket that includes a plate having a first side and a second side with a plurality of feet extending therefrom, and a connector assembly coupled to the second side. The connector assembly includes a circuit board, a terminal block coupled to the circuit board, and a connector coupled to the circuit board with a plurality of wires. The first side is configured to facilitate coupling a field controller thereto. The connector is configured to electrically couple the field controller to the circuit board. The plurality of feet are configured to engage with mounts on a housing of a base unit to facilitate mechanically coupling the bracket thereto. The terminal block is configured to engage with a corresponding terminal block on a base circuit board disposed within the housing of the base unit to electrically couple the circuit board to the base circuit board.

20 Claims, 11 Drawing Sheets

(56) References Cited

U.S. PATENT DOCUMENTS

2003/0167631 A1* 9/2003 Hallenbeck .......... H05K 7/1468
                                                      29/835
2012/0040540 A1* 2/2012 Lee ..................... H01R 12/724
                                                      439/65
2016/0240946 A1* 8/2016 Evans .................. H01R 12/721

FOREIGN PATENT DOCUMENTS

| EP | 1 587 352      | 10/2005 | |
|---|---|---|---|
| EP | 1587352 A2 *   | 10/2005 | ............. H05K 5/061 |
| EP | 2 059 981 A1   | 5/2009  | |
| EP | 2059981 A1 *   | 5/2009  | ............. H01R 31/06 |

* cited by examiner

ADAPTER ASSEMBLY FOR FIELD CONTROLLER UNITS

CROSS-REFERENCE TO RELATED PATENT APPLICATIONS

This application claims the benefit of U.S. Provisional Patent Application No. 62/514,392, filed Jun. 2, 2017, which is incorporated herein by reference in its entirety.

TECHNICAL FIELD

The present disclosure relates generally to field controller units. More specifically, the present disclosure relates to field controller units in the HVAC field of endeavor and include adapter assemblies that provide modularity by facilitating the coupling of various head unit controllers to a base of the field control units.

BACKGROUND

A field controller unit is, in general, a controller configured to control, monitor, and manage equipment of an HVAC system in or around a building or building area. The field controller unit may typically include a base that mounts to a control panel or piece of equipment and a head unit or field controller that attaches to the base. However, to update the hardware of the field controller traditionally requires replacing the entire field controller unit or painstakingly wiring a new field controller to the original base as the new field controller may not mate with the original base.

SUMMARY

One implementation of the present disclosure relates to a field controller adapter. The field controller adapter includes a bracket and a connector assembly. The bracket includes a plate having a first side and an opposing second side with a plurality of feet extending from the second side. The connector assembly is coupled to the second side of the plate. The connector assembly includes a circuit board, a terminal block coupled to the circuit board, and a connector coupled to the circuit board with a plurality of wires. The first side of the plate is configured to facilitate coupling a field controller thereto. The connector is configured to electrically couple the field controller to the circuit board. The plurality of feet are configured to engage with mounts on a housing of a base unit to facilitate mechanically coupling the bracket to the housing. The terminal block is configured to engage with a corresponding terminal block on a base circuit board disposed within the housing of the base unit to electrically couple the circuit board to the base circuit board.

Another implementation of the present disclosure relates to a field controller replacement unit. The field controller replacement unit includes a bracket, a field controller, and a connector assembly. The bracket includes a plate having a first side and an opposing second side with a plurality of feet extending from the second side. The field controller is coupled the first side of the plate. The field controller includes an interface positioned along a peripheral sidewall thereof. The connector assembly is coupled to the second side of the plate. The connector assembly includes a circuit board, a terminal block coupled to the circuit board, and a connector coupled to the circuit board with a plurality of wires. The connector is in releasable engagement with the interface of the field controller, electrically coupling the field controller to the circuit board. The plurality of feet are configured to engage with mounts on a housing of a base unit to facilitate mechanically coupling the bracket to the housing. The terminal block is configured to engage with a corresponding terminal block on a base circuit board disposed within the housing of the base unit to electrically couple the circuit board and the field controller to the base circuit board.

Another implementation of the present disclosure relates to a field controller unit. The field controller unit includes a bracket, a field controller, a connector assembly, and a base unit. The bracket includes a plate having a first side and an opposing second side with a plurality of feet extending from the second side. The field controller is coupled the first side of the plate. The field controller includes an interface positioned along a peripheral sidewall thereof. The connector assembly is coupled to the second side of the plate. The connector assembly includes a first circuit board, a first terminal block coupled to the first circuit board, and a connector coupled to the first circuit board with a plurality of wires. The connector is in releasable engagement with the interface of the field controller, electrically coupling the field controller to the first circuit board. The base unit includes a housing and a second circuit board. The housing defines a cavity and a plurality of mounts. The plurality of mounts are positioned to align with the plurality of feet of the bracket such that the bracket is mechanically couplable to the housing. The second circuit board is disposed within the cavity of the housing. The second circuit board includes a second terminal block positioned to align with the first terminal block of the connector assembly such that the second circuit board is electrically couplable to the field controller and the first circuit board.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

DETAILED DESCRIPTION

Building Management System and HVAC System

Figure 1:
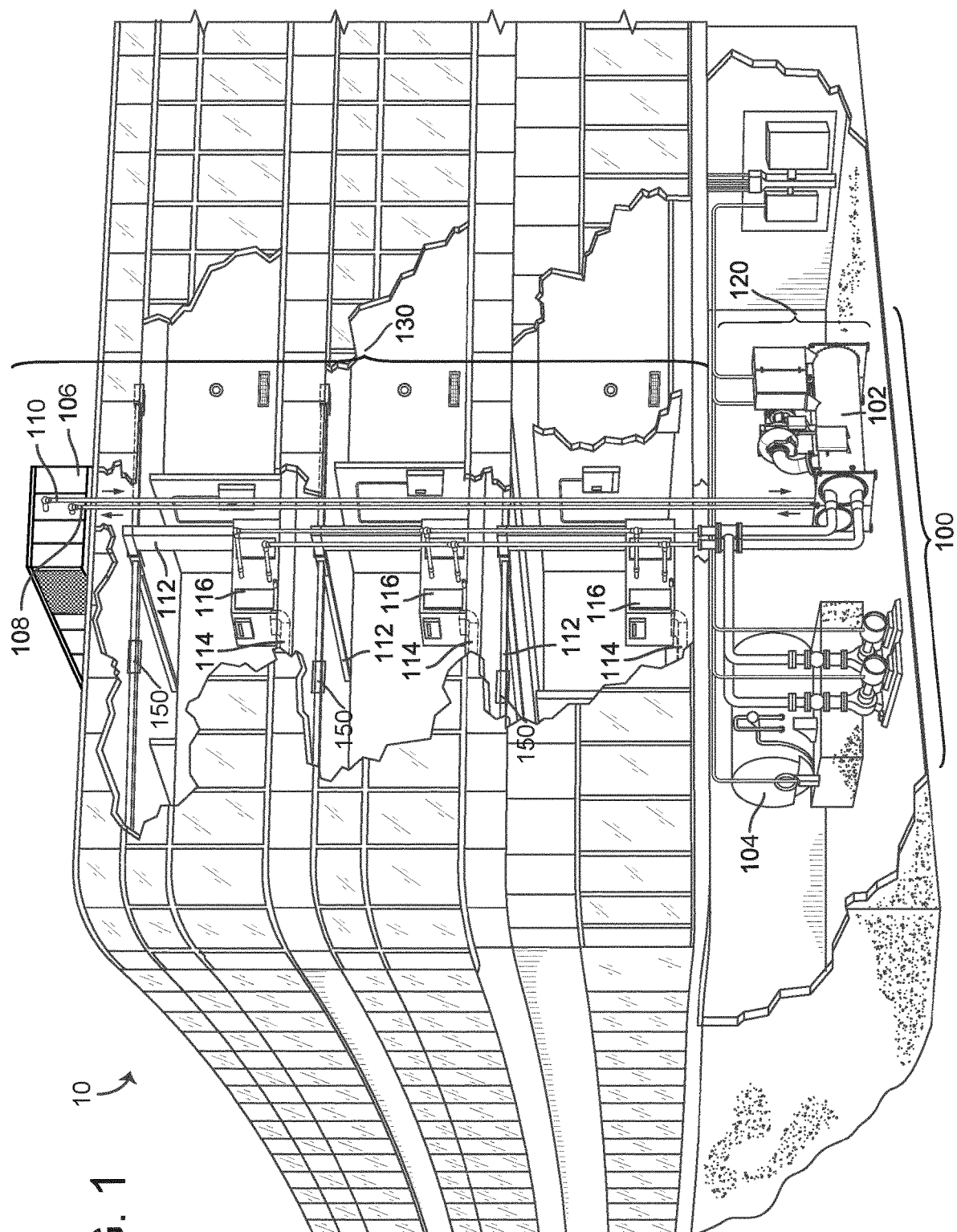
FIG. 1 is a drawing of a building equipped with a building management system (BMS) and a HVAC system, according to some embodiments.

Referring now to FIGS. 1-4, an exemplary building management system (BMS) and HVAC system in which a field controller unit of the present disclosure can be implemented are shown, according to an exemplary embodiment. Referring particularly to FIG. 1, a perspective view of a building 10 is shown. Building 10 is served by a BMS. A BMS is, in general, a system of devices configured to control, monitor, and manage equipment in or around a building or building area. A BMS can include, for example, an HVAC system, a security system, a lighting system, a fire alerting system, and/or any other system that is capable of managing building functions or devices, or any combination thereof.

The BMS that serves building 10 includes an HVAC system 100. HVAC system 100 can include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 can provide a heated or chilled fluid to an air handling unit of airside system 130. Airside system 130 can use the heated or chilled fluid to heat or cool an airflow provided to building 10. An exemplary waterside system and airside system which can be used in HVAC system 100 are described in greater detail with reference to FIGS. 2 and 3.

HVAC system 100 is shown to include a chiller 102, a boiler 104, and a rooftop air handling unit (RTU) 106. Waterside system 120 can use boiler 104 and chiller 102 to heat or cool a working fluid (e.g., water, glycol, etc.) and can circulate the working fluid to RTU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 can add heat to the circulated fluid, for example, by burning a combustible material (e.g., natural gas) or using an electric heating element. Chiller 102 can place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to RTU 106 via piping 108.

RTU 106 can place the working fluid in a heat exchange relationship with an airflow passing through RTU 106 (e.g., via one or more stages of cooling coils and/or heating coils). The airflow can be, for example, outside air, return air from within building 10, or a combination of both. RTU 106 can transfer heat between the airflow and the working fluid to provide heating or cooling for the airflow. For example, RTU 106 can include one or more fans or blowers configured to pass the airflow over or through a heat exchanger containing the working fluid. The working fluid can then return to chiller 102 or boiler 104 via piping 110.

Airside system 130 can deliver the airflow supplied by RTU 106 (i.e., the supply airflow) to building 10 via air supply ducts 112 and can provide return air from building 10 to RTU 106 via air return ducts 114. In some embodiments, airside system 130 includes multiple local air handling units (AHUs) 116 positioned within building 10. The AHUs 116 may include various components similar to the RTU 106. In some embodiments, the airside system 130 includes variable air volume (VAV) units 150. For example, airside system 130 is shown to include a separate VAV unit 150 on each floor or zone of building 10. VAV units 150 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 150 or other flow control elements. RTU 106 and/or AHUs 116 can include various sensors (e.g., temperature sensors, pressure sensors, etc.) configured to measure attributes of the supply airflow. RTU 106 and/or AHUs 116 can receive input from sensors located within RTU 106 and/or AHUs 116 and/or within the building zone and can adjust the flow rate, temperature, or other attributes of the supply airflow through RTU 106 and/or AHUs 116 to achieve setpoint conditions for the building zone.

Figure 2:
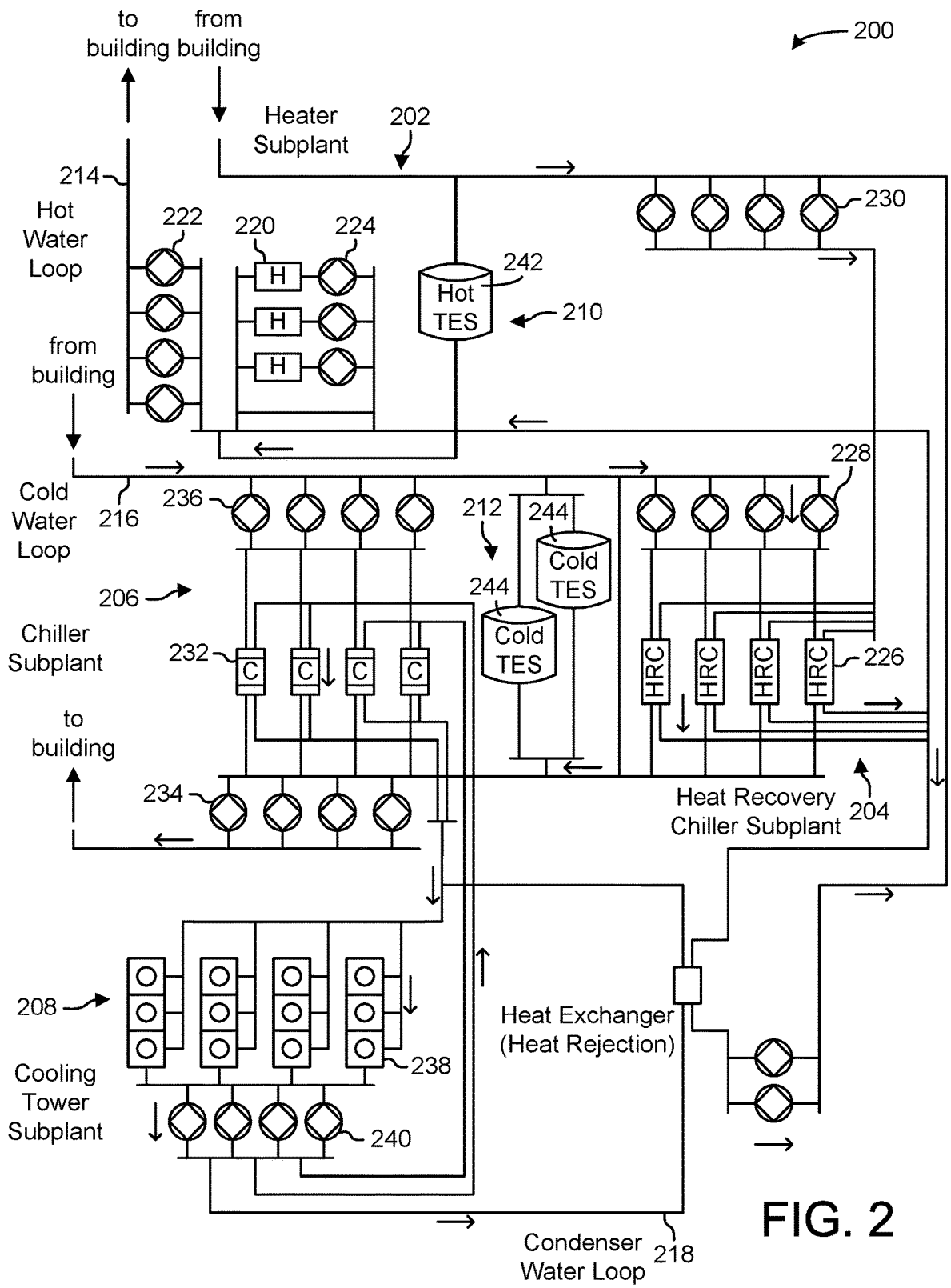
FIG. 2 is a schematic of a waterside system which can be used as part of the HVAC system of FIG. 1, according to some embodiments.

Referring now to FIG. 2, a block diagram of a waterside system 200 is shown, according to an exemplary embodiment. In various embodiments, waterside system 200 can supplement or replace waterside system 120 in HVAC system 100 or can be implemented separate from HVAC system 100. When implemented in HVAC system 100, waterside system 200 can include a subset of the HVAC devices in HVAC system 100 (e.g., boiler 104, chiller 102, pumps, valves, etc.) and can operate to supply a heated or chilled fluid to RTU 106 and/or AHUs 116. The HVAC devices of waterside system 200 can be located within building 10 (e.g., as components of waterside system 120) or at an offsite location such as a central plant.

In FIG. 2, waterside system 200 is shown as a central plant having a plurality of subplants 202-212. Subplants 202-212 are shown to include a heater subplant 202, a heat recovery chiller subplant 204, a chiller subplant 206, a cooling tower subplant 208, a hot thermal energy storage (TES) subplant 210, and a cold thermal energy storage (TES) subplant 212. Subplants 202-212 consume resources (e.g., water, natural gas, electricity, etc.) from utilities to serve the thermal energy loads (e.g., hot water, cold water, heating, cooling, etc.) of a building or campus. For example, heater subplant 202 can be configured to heat water in a hot water loop 214 that circulates the hot water between heater subplant 202 and building 10. Chiller subplant 206 can be configured to chill water in a cold water loop 216 that circulates the cold water between chiller subplant 206 and building 10. Heat recovery chiller subplant 204 can be configured to transfer heat from cold water loop 216 to hot water loop 214 to provide additional heating for the hot water and additional cooling for the cold water. Condenser water loop 218 can absorb heat from the cold water in chiller subplant 206 and reject the absorbed heat in cooling tower subplant 208 or transfer the absorbed heat to hot water loop 214. Hot TES subplant 210 and cold TES subplant 212 can store hot and cold thermal energy, respectively, for subsequent use.

Hot water loop 214 and cold water loop 216 can deliver the heated and/or chilled water to air handlers located on the rooftop of building 10 (e.g., RTU 106) or to individual floors or zones of building 10 (e.g., AHUs 116, VAV units 150). The air handlers push air past heat exchangers (e.g., heating coils or cooling coils) through which the water flows to provide heating or cooling for the air. The heated or cooled air can be delivered to individual zones of building 10 to serve the thermal energy loads of building 10. The water then returns to subplants 202-212 to receive further heating or cooling.

Although subplants 202-212 are shown and described as heating and cooling water for circulation to a building, it is understood that any other type of working fluid (e.g., glycol, CO2, etc.) can be used in place of or in addition to water to serve the thermal energy loads. In other embodiments, subplants 202-212 can provide heating and/or cooling directly to the building or campus without requiring an intermediate heat transfer fluid. These and other variations to waterside system 200 are within the teachings of the present invention.

Each of subplants 202-212 can include a variety of equipment configured to facilitate the functions of the subplant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

Hot TES subplant 210 is shown to include a hot TES tank 242 configured to store the hot water for later use. Hot TES subplant 210 can also include one or more pumps or valves configured to control the flow rate of the hot water into or out of hot TES tank 242. Cold TES subplant 212 is shown to include cold TES tanks 244 configured to store the cold water for later use. Cold TES subplant 212 can also include one or more pumps or valves configured to control the flow rate of the cold water into or out of cold TES tanks 244.

In some embodiments, one or more of the pumps in waterside system 200 (e.g., pumps 222, 224, 228, 230, 234, 236, and/or 240) or pipelines in waterside system 200 include an isolation valve associated therewith. Isolation valves can be integrated with the pumps or positioned upstream or downstream of the pumps to control the fluid flows in waterside system 200. In various embodiments, waterside system 200 can include more, fewer, or different types of devices and/or subplants based on the particular configuration of waterside system 200 and the types of loads served by waterside system 200.

Figure 3:
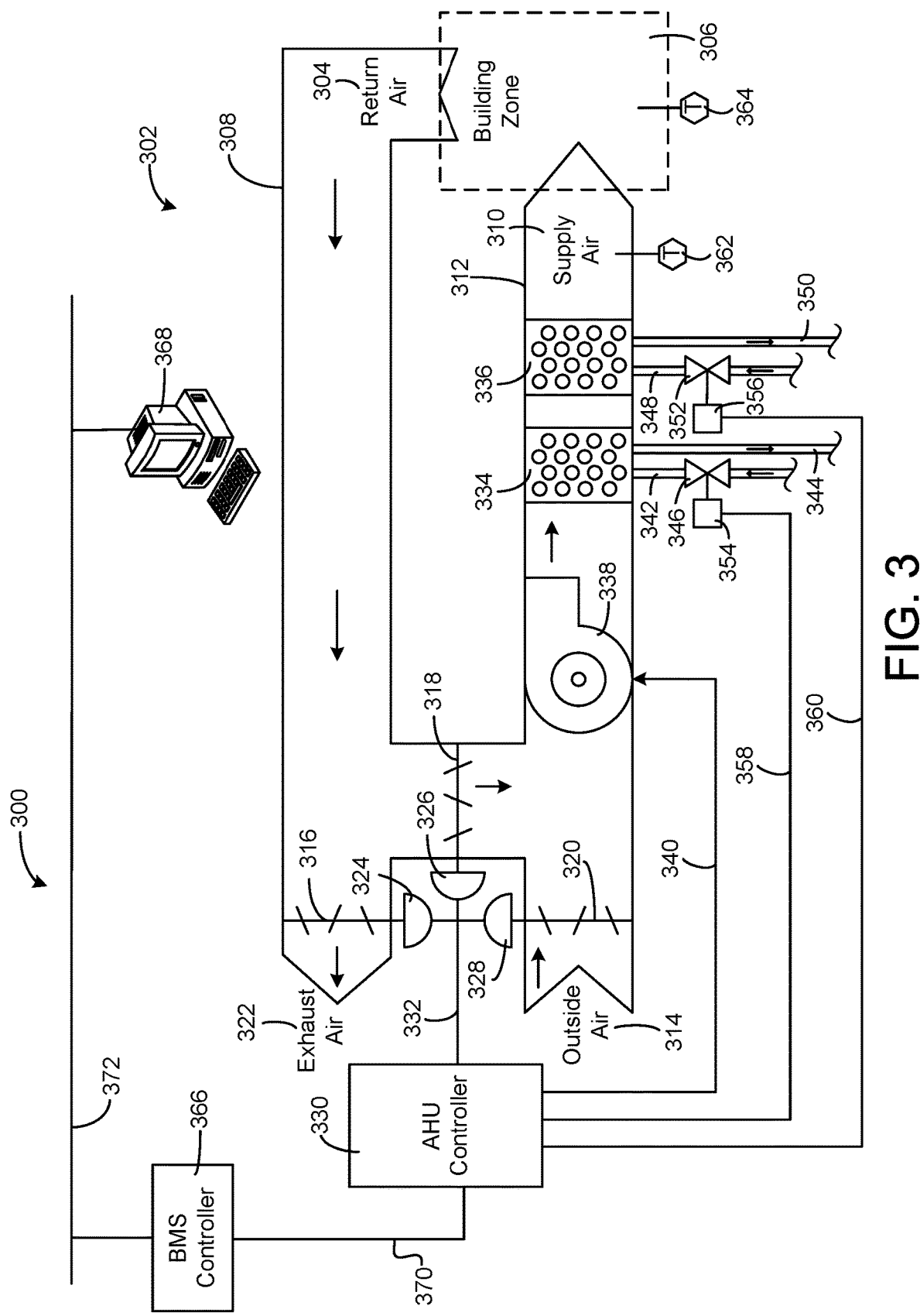
FIG. 3 is a block diagram of an airside system which can be used as part of the HVAC system of FIG. 1, according to some embodiments.

Referring now to FIG. 3, a block diagram of an airside system 300 is shown, according to an exemplary embodiment. In various embodiments, airside system 300 can supplement or replace airside system 130 in HVAC system 100 or can be implemented separate from HVAC system 100. When implemented in HVAC system 100, airside system 300 can include a subset of the HVAC devices in HVAC system 100 (e.g., RTU 106, AHUs 116, VAV units 150, ducts 112-114, fans, dampers, etc.) and can be located in or around building 10. Airside system 300 can operate to heat or cool an airflow provided to building 10 using a heated or chilled fluid provided by waterside system 200.

In FIG. 3, airside system 300 is shown to include an economizer-type air handling unit (AHU) 302. Economizer-type AHUs vary the amount of outside air and return air used by the air handling unit for heating or cooling. For example, AHU 302 can receive return air 304 from building zone 306 via return air duct 308 and can deliver supply air 310 to building zone 306 via supply air duct 312. In some embodiments, AHU 302 is a rooftop unit located on the roof of building 10 (e.g., RTU 106 as shown in FIG. 1) or otherwise positioned to receive both return air 304 and outside air 314 (e.g., AHUs 116 as shown in FIG. 1). AHU 302 can be configured to operate exhaust air damper 316, mixing damper 318, and outside air damper 320 to control an amount of outside air 314 and return air 304 that combine to form supply air 310. Any return air 304 that does not pass through mixing damper 318 can be exhausted from AHU 302 through exhaust damper 316 as exhaust air 322.

Each of dampers 316-320 can be operated by an actuator. For example, exhaust air damper 316 can be operated by actuator 324, mixing damper 318 can be operated by actuator 326, and outside air damper 320 can be operated by actuator 328. Actuators 324-328 can communicate with an AHU controller 330 via a communications link 332. Actuators 324-328 can receive control signals from AHU controller 330 and can provide feedback signals to AHU controller 330. Feedback signals can include, for example, an indication of a current actuator or damper position, an amount of torque or force exerted by the actuator, diagnostic information (e.g., results of diagnostic tests performed by actuators 324-328), status information, commissioning information, configuration settings, calibration data, and/or other types of information or data that can be collected, stored, or used by actuators 324-328. AHU controller 330 can be an economizer controller configured to use one or more control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control actuators 324-328.

Still referring to FIG. 3, AHU 302 is shown to include a cooling coil 334, a heating coil 336, and a fan 338 positioned within supply air duct 312. Fan 338 can be configured to force supply air 310 through cooling coil 334 and/or heating coil 336 and provide supply air 310 to building zone 306. AHU controller 330 can communicate with fan 338 via communications link 340 to control a flow rate of supply air 310. In some embodiments, AHU controller 330 controls an amount of heating or cooling applied to supply air 310 by modulating a speed of fan 338.

Cooling coil 334 can receive a chilled fluid from waterside system 200 (e.g., from cold water loop 216) via piping 342 and can return the chilled fluid to waterside system 200 via piping 344. Valve 346 can be positioned along piping 342 or piping 344 to control a flow rate of the chilled fluid through cooling coil 334. In some embodiments, cooling coil 334 includes multiple stages of cooling coils that can be independently activated and deactivated (e.g., by AHU controller 330, by BMS controller 366, etc.) to modulate an amount of cooling applied to supply air 310.

Heating coil 336 can receive a heated fluid from waterside system 200 (e.g., from hot water loop 214) via piping 348 and can return the heated fluid to waterside system 200 via piping 350. Valve 352 can be positioned along piping 348 or piping 350 to control a flow rate of the heated fluid through heating coil 336. In some embodiments, heating coil 336 includes multiple stages of heating coils that can be independently activated and deactivated (e.g., by AHU controller 330, by BMS controller 366, etc.) to modulate an amount of heating applied to supply air 310.

Each of valves 346 and 352 can be controlled by an actuator. For example, valve 346 can be controlled by actuator 354 and valve 352 can be controlled by actuator 356. Actuators 354-356 can communicate with AHU controller 330 via communications links 358-360.

Actuators 354-356 can receive control signals from AHU controller 330 and can provide feedback signals to controller 330. In some embodiments, AHU controller 330 receives a measurement of the supply air temperature from a temperature sensor 362 positioned in supply air duct 312 (e.g., downstream of cooling coil 334 and/or heating coil 336). AHU controller 330 can also receive a measurement of the temperature of building zone 306 from a temperature sensor 364 located in building zone 306.

In some embodiments, AHU controller 330 operates valves 346 and 352 via actuators 354-356 to modulate an amount of heating or cooling provided to supply air 310 (e.g., to achieve a setpoint temperature for supply air 310 or to maintain the temperature of supply air 310 within a setpoint temperature range). The positions of valves 346 and 352 affect the amount of heating or cooling provided to supply air 310 by cooling coil 334 or heating coil 336 and may correlate with the amount of energy consumed to achieve a desired supply air temperature. AHU controller 330 can control the temperature of supply air 310 and/or building zone 306 by activating or deactivating coils 334-336, adjusting a speed of fan 338, or a combination of both.

Still referring to FIG. 3, airside system 300 is shown to include a building management system (BMS) controller 366 and a client device 368. BMS controller 366 can include one or more computer systems (e.g., servers, supervisory controllers, subsystem controllers, etc.) that serve as system level controllers, application or data servers, head nodes, or master controllers for airside system 300, waterside system 200, HVAC system 100, and/or other controllable systems that serve building 10. BMS controller 366 can communicate with multiple downstream building systems or subsystems (e.g., HVAC system 100, a security system, a lighting system, waterside system 200, etc.) via a communications link 370 according to like or disparate protocols (e.g., LON, BACnet, etc.). In various embodiments, AHU controller 330 and BMS controller 366 can be separate (as shown in FIG. 3) or integrated. In an integrated implementation, AHU controller 330 can be a software module configured for execution by a processor of BMS controller 366.

In some embodiments, AHU controller 330 receives information from BMS controller 366 (e.g., commands, setpoints, operating boundaries, etc.) and provides information to BMS controller 366 (e.g., temperature measurements, valve or actuator positions, operating statuses, diagnostics, etc.). For example, AHU controller 330 can provide BMS controller 366 with temperature measurements from temperature sensors 362-364, equipment on/off states, equipment operating capacities, and/or any other information that can be used by BMS controller 366 to monitor or control a variable state or condition within building zone 306.

Client device 368 can include one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with HVAC system 100, its subsystems, and/or devices. Client device 368 can be a computer workstation, a client terminal, a remote or local interface, or any other type of user interface device. Client device 368 can be a stationary terminal or a mobile device. For example, client device 368 can be a desktop computer, a computer server with a user interface, a laptop computer, a tablet, a smartphone, a PDA, or any other type of mobile or non-mobile device. Client device 368 can communicate with BMS controller 366 and/or AHU controller 330 via communications link 372.

Figure 4:
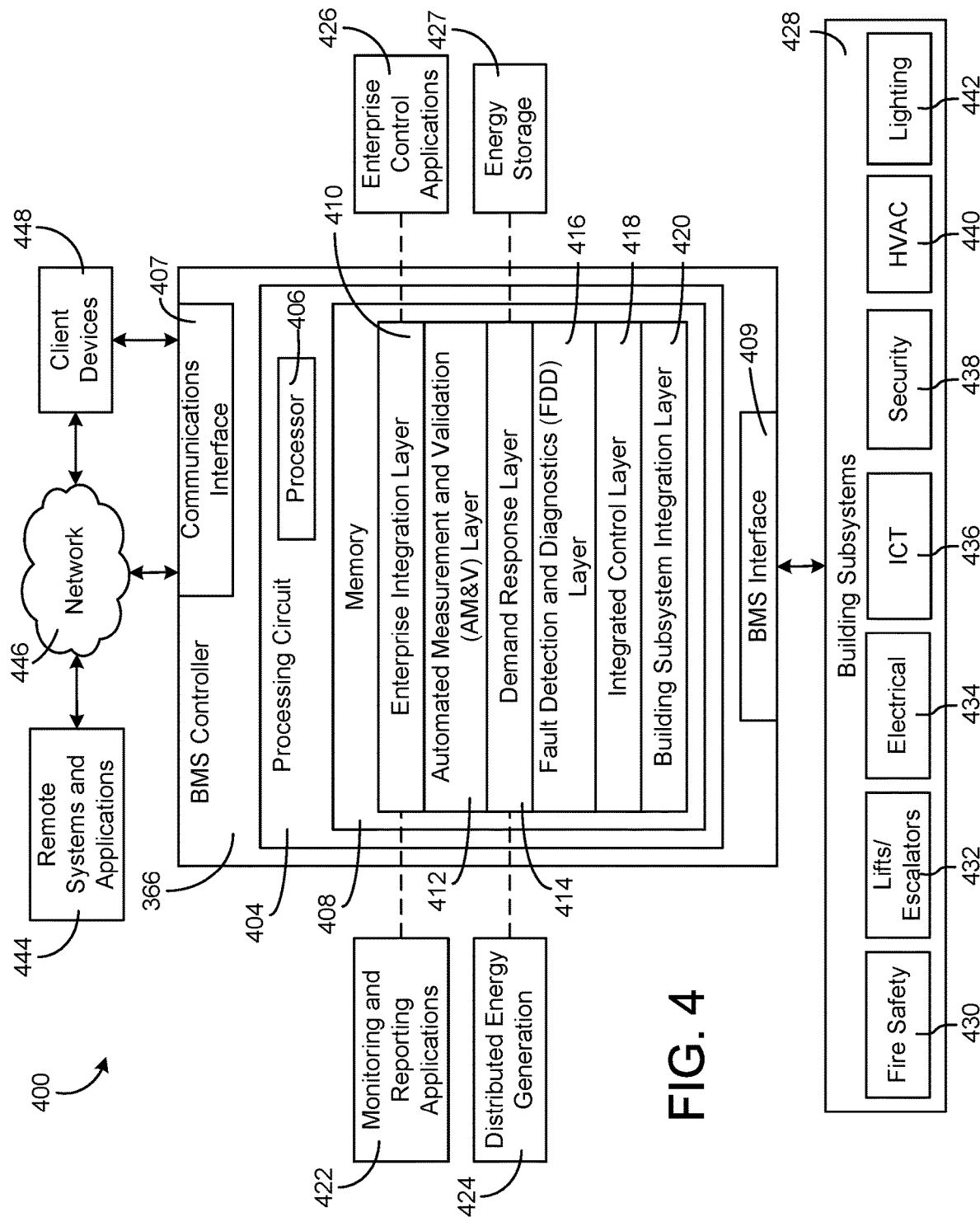
FIG. 4 is a block diagram of a Building Management System (BMS) which can be used in the building of FIG. 1, according to some embodiments.

Referring now to FIG. 4, a block diagram of a building management system (BMS) 400 is shown, according to an exemplary embodiment. BMS 400 can be implemented in building 10 to automatically monitor and control various building functions. BMS 400 is shown to include BMS controller 366 and a plurality of building subsystems 428. Building subsystems 428 are shown to include a building electrical subsystem 434, an information communication technology (ICT) subsystem 436, a security subsystem 438, a HVAC subsystem 440, a lighting subsystem 442, a lift/escalators subsystem 432, and a fire safety subsystem 430. In various embodiments, building subsystems 428 can include fewer, additional, or alternative subsystems. For example, building subsystems 428 can also or alternatively include a refrigeration subsystem, an advertising or signage subsystem, a cooking subsystem, a vending subsystem, a printer or copy service subsystem, or any other type of building subsystem that uses controllable equipment and/or sensors to monitor or control building 10. In some embodiments, building subsystems 428 include waterside system 200 and/or airside system 300, as described with reference to FIGS. 2 and 3.

Each of building subsystems 428 can include any number of devices, controllers, and connections for completing its individual functions and control activities. HVAC subsystem 440 can include many of the same components as HVAC system 100, as described with reference to FIGS. 1-3. For example, HVAC subsystem 440 can include a chiller, a boiler, any number of air handling units, economizers, field controllers, VAV controllers, supervisory controllers, actuators, temperature sensors, and other devices for controlling the temperature, humidity, airflow, or other variable conditions within building 10. Lighting subsystem 442 can include any number of light fixtures, ballasts, lighting sensors, dimmers, or other devices configured to controllably adjust the amount of light provided to a building space. Security subsystem 438 can include occupancy sensors, video surveillance cameras, digital video recorders, video processing servers, intrusion detection devices, access control devices (e.g., card access, etc.) and servers, or other security-related devices.

Still referring to FIG. 4, BMS controller 366 is shown to include a communications interface 407 and a BMS interface 409. Interface 407 can facilitate communications between BMS controller 366 and external applications (e.g., monitoring and reporting applications 422, enterprise control applications 426, remote systems and applications 444, applications residing on client devices 448, etc.) for allowing user control, monitoring, and adjustment to BMS controller 366 and/or subsystems 428. Interface 407 can also facilitate communications between BMS controller 366 and client devices 448. BMS interface 409 can facilitate communications between BMS controller 366 and building subsystems 428 (e.g., HVAC, lighting security, lifts, power distribution, business, etc.).

Interfaces 407, 409 can be or include wired or wireless communications interfaces (e.g., jacks, antennas, transmitters, receivers, transceivers, wire terminals, etc.) for conducting data communications with building subsystems 428 or other external systems or devices. In various embodiments, communications via interfaces 407, 409 can be direct (e.g., local wired or wireless communications) or via a communications network 446 (e.g., a WAN, the Internet, a cellular network, etc.). For example, interfaces 407, 409 can include an Ethernet card and port for sending and receiving data via an Ethernet-based communications link or network. In another example, interfaces 407, 409 can include a Wi-Fi transceiver for communicating via a wireless communications network. In another example, one or both of interfaces 407, 409 can include cellular or mobile phone communications transceivers. In one embodiment, communications interface 407 is a power line communications interface and BMS interface 409 is an Ethernet interface. In other embodiments, both communications interface 407 and BMS interface 409 are Ethernet interfaces or are the same Ethernet interface.

Still referring to FIG. 4, BMS controller 366 is shown to include a processing circuit 404 including a processor 406 and memory 408. Processing circuit 404 can be communicably connected to BMS interface 409 and/or communications interface 407 such that processing circuit 404 and the various components thereof can send and receive data via interfaces 407, 409. Processor 406 can be implemented as a general purpose processor, an application specific integrated circuit (ASIC), one or more field programmable gate arrays (FPGAs), a group of processing components, or other suitable electronic processing components.

Memory 408 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 408 can be or include volatile memory or non-volatile memory. Memory 408 can include database components, object code components, script components, or any other type of information structure for supporting the various activities and information structures described in the present application. According to an exemplary embodiment, memory 408 is communicably connected to processor 406 via processing circuit 404 and includes computer code for executing (e.g., by processing circuit 404 and/or processor 406) one or more processes described herein.

In some embodiments, BMS controller 366 is implemented within a single computer (e.g., one server, one housing, etc.). In various other embodiments BMS controller 366 can be distributed across multiple servers or computers (e.g., that can exist in distributed locations). Further, while FIG. 4 shows applications 422 and 426 as existing outside of BMS controller 366, in some embodiments, applications 422 and 426 can be hosted within BMS controller 366 (e.g., within memory 408).

Still referring to FIG. 4, memory 408 is shown to include an enterprise integration layer 410, an automated measurement and validation (AM&V) layer 412, a demand response (DR) layer 414, a fault detection and diagnostics (FDD) layer 416, an integrated control layer 418, and a building subsystem integration later 420. Layers 410-420 can be configured to receive inputs from building subsystems 428 and other data sources, determine optimal control actions for building subsystems 428 based on the inputs, generate control signals based on the optimal control actions, and provide the generated control signals to building subsystems 428. The following paragraphs describe some of the general functions performed by each of layers 410-420 in BMS 400.

Enterprise integration layer 410 can be configured to serve clients or local applications with information and services to support a variety of enterprise-level applications. For example, enterprise control applications 426 can be configured to provide subsystem-spanning control to a graphical user interface (GUI) or to any number of enterprise-level business applications (e.g., accounting systems, user identification systems, etc.). Enterprise control applications 426 can also or alternatively be configured to provide configuration GUIs for configuring BMS controller 366. In yet other embodiments, enterprise control applications 426 can work with layers 410-420 to optimize building performance (e.g., efficiency, energy use, comfort, or safety) based on inputs received at interface 407 and/or BMS interface 409.

Building subsystem integration layer 420 can be configured to manage communications between BMS controller 366 and building subsystems 428. For example, building subsystem integration layer 420 can receive sensor data and input signals from building subsystems 428 and provide output data and control signals to building subsystems 428. Building subsystem integration layer 420 can also be configured to manage communications between building subsystems 428. Building subsystem integration layer 420 translate communications (e.g., sensor data, input signals, output signals, etc.) across a plurality of multi-vendor/multi-protocol systems.

Demand response layer 414 can be configured to optimize resource usage (e.g., electricity use, natural gas use, water use, etc.) and/or the monetary cost of such resource usage in response to satisfy the demand of building 10. The optimization can be based on time-of-use prices, curtailment signals, energy availability, or other data received from utility providers, distributed energy generation systems 424, from energy storage 427 (e.g., hot TES 242, cold TES 244, etc.), or from other sources. Demand response layer 414 can receive inputs from other layers of BMS controller 366 (e.g., building subsystem integration layer 420, integrated control layer 418, etc.). The inputs received from other layers can include environmental or sensor inputs such as temperature, carbon dioxide levels, relative humidity levels, air quality sensor outputs, occupancy sensor outputs, room schedules, and the like. The inputs can also include inputs such as electrical use (e.g., expressed in kWh), thermal load measurements, pricing information, projected pricing, smoothed pricing, curtailment signals from utilities, and the like.

According to an exemplary embodiment, demand response layer 414 includes control logic for responding to the data and signals it receives. These responses can include communicating with the control algorithms in integrated control layer 418, changing control strategies, changing setpoints, or activating/deactivating building equipment or subsystems in a controlled manner. Demand response layer 414 can also include control logic configured to determine when to utilize stored energy. For example, demand response layer 414 can determine to begin using energy from energy storage 427 just prior to the beginning of a peak use hour.

In some embodiments, demand response layer 414 includes a control module configured to actively initiate control actions (e.g., automatically changing setpoints) which minimize energy costs based on one or more inputs representative of or based on demand (e.g., price, a curtailment signal, a demand level, etc.). In some embodiments, demand response layer 414 uses equipment models to determine an optimal set of control actions. The equipment models can include, for example, thermodynamic models describing the inputs, outputs, and/or functions performed by various sets of building equipment. Equipment models can represent collections of building equipment (e.g., subplants, chiller arrays, etc.) or individual devices (e.g., individual chillers, heaters, pumps, etc.).

Demand response layer 414 can further include or draw upon one or more demand response policy definitions (e.g., databases, XML files, etc.). The policy definitions can be edited or adjusted by a user (e.g., via a graphical user interface) so that the control actions initiated in response to demand inputs can be tailored for the user's application, desired comfort level, particular building equipment, or based on other concerns. For example, the demand response policy definitions can specify which equipment can be turned on or off in response to particular demand inputs, how long a system or piece of equipment should be turned off, what setpoints can be changed, what the allowable set point adjustment range is, how long to hold a high demand setpoint before returning to a normally scheduled setpoint, how close to approach capacity limits, which equipment modes to utilize, the energy transfer rates (e.g., the maximum rate, an alarm rate, other rate boundary information, etc.) into and out of energy storage devices (e.g., thermal storage tanks, battery banks, etc.), and when to dispatch on-site generation of energy (e.g., via fuel cells, a motor generator set, etc.).

Integrated control layer 418 can be configured to use the data input or output of building subsystem integration layer 420 and/or demand response later 414 to make control decisions. Due to the subsystem integration provided by building subsystem integration layer 420, integrated control layer 418 can integrate control activities of the subsystems 428 such that the subsystems 428 behave as a single integrated supersystem. In an exemplary embodiment, integrated control layer 418 includes control logic that uses inputs and outputs from a plurality of building subsystems to provide greater comfort and energy savings relative to the comfort and energy savings that separate subsystems could provide alone. For example, integrated control layer 418 can be configured to use an input from a first subsystem to make an energy-saving control decision for a second subsystem. Results of these decisions can be communicated back to building subsystem integration layer 420.

Integrated control layer 418 is shown to be logically below demand response layer 414. Integrated control layer 418 can be configured to enhance the effectiveness of demand response layer 414 by enabling building subsystems 428 and their respective control loops to be controlled in coordination with demand response layer 414. This configuration may advantageously reduce disruptive demand response behavior relative to conventional systems. For example, integrated control layer 418 can be configured to assure that a demand response-driven upward adjustment to the setpoint for chilled water temperature (or another component that directly or indirectly affects temperature) does not result in an increase in fan energy (or other energy used to cool a space) that would result in greater total building energy use than was saved at the chiller.

Integrated control layer 418 can be configured to provide feedback to demand response layer 414 so that demand response layer 414 checks that constraints (e.g., temperature, lighting levels, etc.) are properly maintained even while demanded load shedding is in progress. The constraints can also include setpoint or sensed boundaries relating to safety, equipment operating limits and performance, comfort, fire codes, electrical codes, energy codes, and the like. Integrated control layer 418 is also logically below fault detection and diagnostics layer 416 and automated measurement and validation layer 412. Integrated control layer 418 can be configured to provide calculated inputs (e.g., aggregations) to these higher levels based on outputs from more than one building subsystem.

Automated measurement and validation (AM&V) layer 412 can be configured to verify that control strategies commanded by integrated control layer 418 or demand response layer 414 are working properly (e.g., using data aggregated by AM&V layer 412, integrated control layer 418, building subsystem integration layer 420, FDD layer 416, or otherwise). The calculations made by AM&V layer 412 can be based on building system energy models and/or equipment models for individual BMS devices or subsystems. For example, AM&V layer 412 can compare a model-predicted output with an actual output from building subsystems 428 to determine an accuracy of the model.

Fault detection and diagnostics (FDD) layer 416 can be configured to provide on-going fault detection for building subsystems 428, building subsystem devices (i.e., building equipment), and control algorithms used by demand response layer 414 and integrated control layer 418. FDD layer 416 can receive data inputs from integrated control layer 418, directly from one or more building subsystems or devices, or from another data source. FDD layer 416 can automatically diagnose and respond to detected faults. The responses to detected or diagnosed faults can include providing an alert message to a user, a maintenance scheduling system, or a control algorithm configured to attempt to repair the fault or to work-around the fault.

FDD layer 416 can be configured to output a specific identification of the faulty component or cause of the fault (e.g., loose damper linkage) using detailed subsystem inputs available at building subsystem integration layer 420. In other exemplary embodiments, FDD layer 416 is configured to provide "fault" events to integrated control layer 418 which executes control strategies and policies in response to the received fault events. According to an exemplary embodiment, FDD layer 416 (or a policy executed by an integrated control engine or business rules engine) can shut-down systems or direct control activities around faulty devices or systems to reduce energy waste, extend equipment life, or assure proper control response.

FDD layer 416 can be configured to store or access a variety of different system data stores (or data points for live data). FDD layer 416 can use some content of the data stores to identify faults at the equipment level (e.g., specific chiller, specific AHU, specific terminal unit, etc.) and other content to identify faults at component or subsystem levels. For example, building subsystems 428 can generate temporal (i.e., time-series) data indicating the performance of BMS 400 and the various components thereof. The data generated by building subsystems 428 can include measured or calculated values that exhibit statistical characteristics and provide information about how the corresponding system or process (e.g., a temperature control process, a flow control process, etc.) is performing in terms of error from its setpoint. These processes can be examined by FDD layer 416 to expose when the system begins to degrade in performance and alert a user to repair the fault before it becomes more severe.

Field Controller and Adapter Assembly

Referring now to FIGS. 5-17, a controller unit, shown as field controller unit 500, is shown according to an exemplary embodiment. Field controller unit 500 may be usable with BMS 400 and/or the HVAC system 100. The field controller unit 500 may be configured to control one or more components of the HVAC system 100 and/or other building subsystems 428 (e.g., an air handling unit controller, a VAV controller, a fan unit controller, a lighting controller, etc.). As shown in FIGS. 5-17, the field controller unit 500 includes a bracket, shown as adapter bracket 600; an electrical connector assembly, shown as connector assembly 700; a head unit or controller, shown as field controller 800; and a base unit, shown as base 900.

According to an exemplary embodiment, the adapter bracket 600 is configured to facilitate coupling the field controller 800 to the base 900. By way of example, the base 900 may have originally included a field controller that was designed to interface directly with the base 900 such that the adapter bracket 600 was not needed (e.g., the originally field controller and the base 900 were designed as a single field controller unit, etc.). However, as the hardware of the original field controller becomes outdated, obsolete, and/or discontinued, and new field controllers such as the field controller 800 are designed, the original field controller of the field controller unit 500 may need to be replaced to maintain operational functionality. Rather than removing the entire field controller unit 500 from its mounting location (e.g., on a control panel within an electrical room, on a respective HVAC component, on a metal base panel in a steel enclosure, etc.), the original field controller may be removed from base 900 which may remain in its original location, and the field controller 800 may then replace the original field controller.

However, since the field controller 800 is a newer, updated model, the overall dimensions and shape may differ from that of the original field controller such that the field controller 800 and the base 900 have disparate shapes and are not capable of interfacing directly with one another (e.g., non-mating components, etc.). Typically, a non-mating field controller and base assembly, such as the field controller 800 and the base 900, require that an installer or technician spend numerous hours (e.g., 5-10 hours, etc.) cutting, crimping, soldering, splicing, etc. wires to electrically couple the interfaces of the field controller 800 to the base 900 (e.g., which is inefficient, prone to errors, etc.). According to an exemplary embodiment, the adapter bracket 600 and the connector assembly 700 facilitate coupling the field controller 800 to the base 900 in a relatively short time (e.g., less than an hour, etc.). By way of example, the adapter bracket 600 and the connector assembly 700 may be preconfigured and prewired such that the field controller 800 may be easily, efficiently, and properly connected to base 900.

Figure 7:
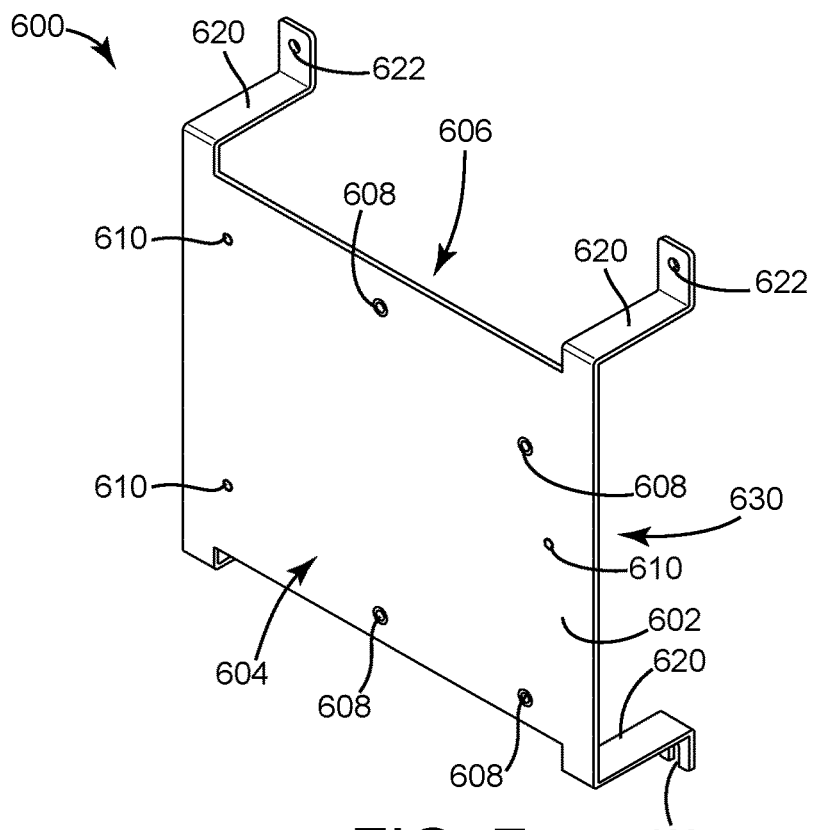
FIGS. 7-9 are various views of an adapter bracket of the field controller unit of FIG. 5, according to some embodiments.
Figure 8:
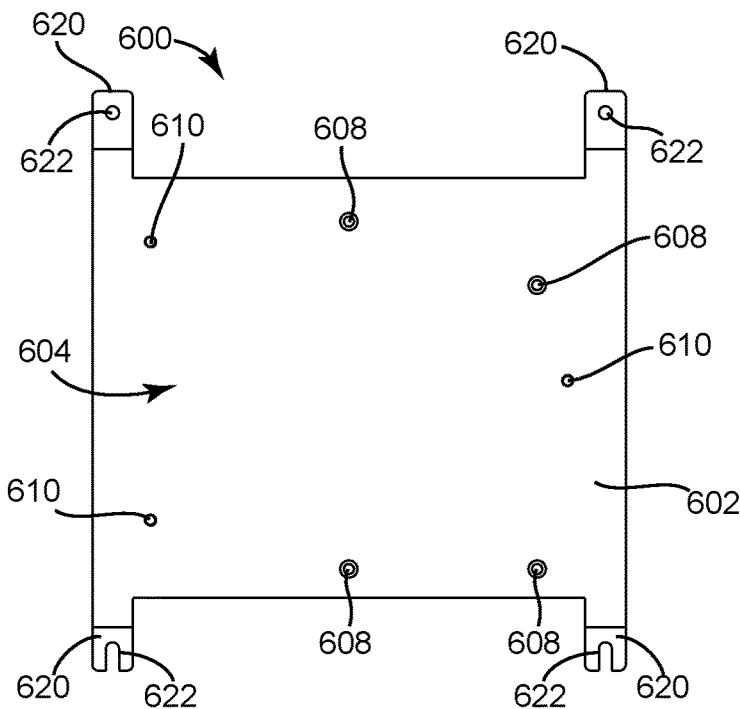
Figure 9:
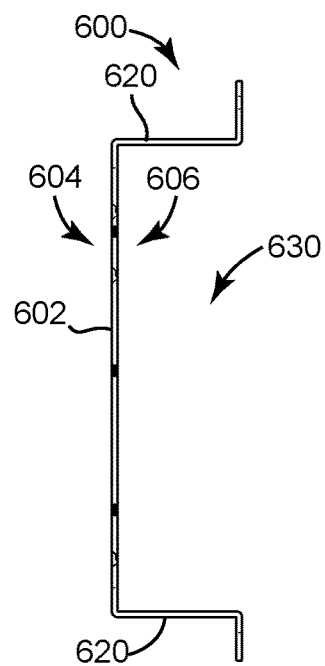

As shown in FIGS. 7-9, the adapter bracket 600 includes a plate, shown as plate 602, having a first side, shown as top side 604, and an opposing second side, shown as underside 606.

The adapter bracket 600 includes a plurality of feet, shown as feet 620, extending rearward of the underside 606 of the plate 602 (e.g., at the corners thereof, etc.) which defines a recess, shown as recess 630. As shown in FIGS. 7 and 8, the plate 602 defines a first plurality of apertures, shown as connector assembly apertures 608, and a second plurality of apertures, shown as field controller apertures 610. According to an exemplary embodiment, the connector assembly apertures 608 facilitate coupling the connector assembly 700 to the underside 606 of the plate 602 and the field controller apertures 610 facilitate coupling the field controller 800 to the top side 604 of the plate 602. As shown in FIGS. 7 and 8, each of the feet 620 define a third aperture, shown as base apertures 622. According to an exemplary embodiment, the base apertures 622 facilitate coupling the adapter bracket 600 to the base 900.

Figure 10:
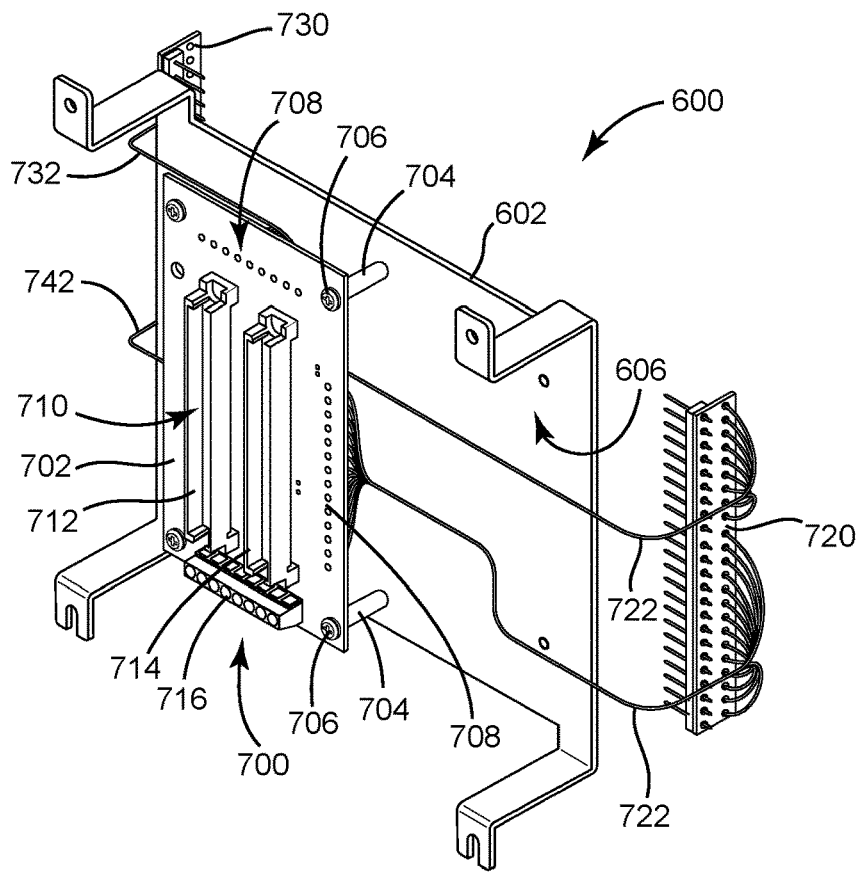
FIGS. 10-13 are various views of a connector assembly of the field controller unit of FIG. 5 coupled to the adapter bracket of FIGS. 7-9, according to some embodiments.
Figure 11:
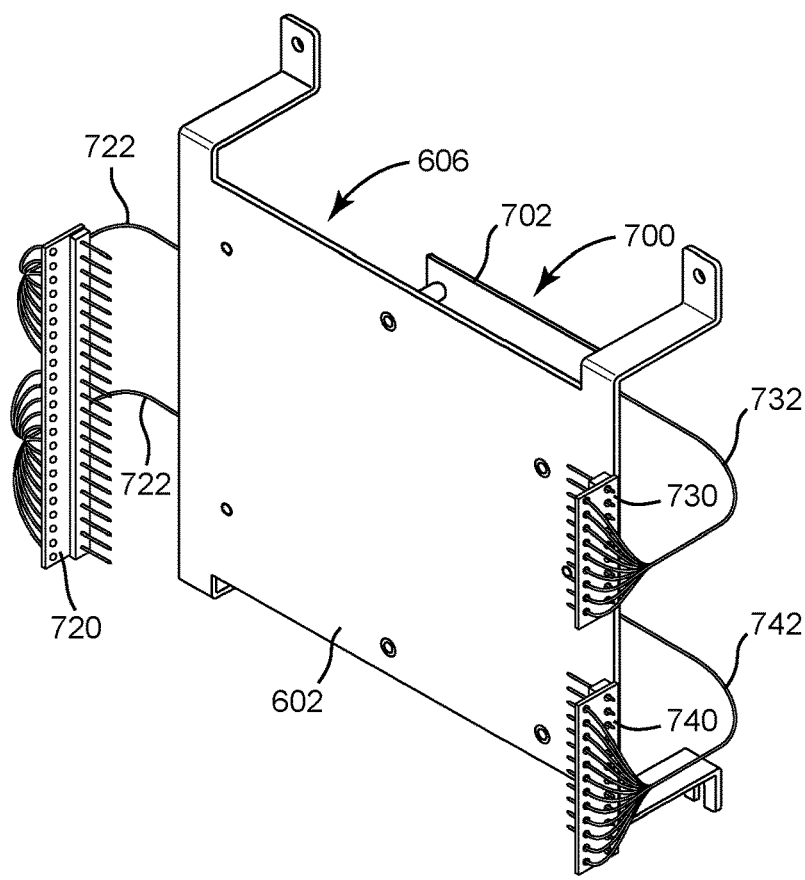
Figure 12:
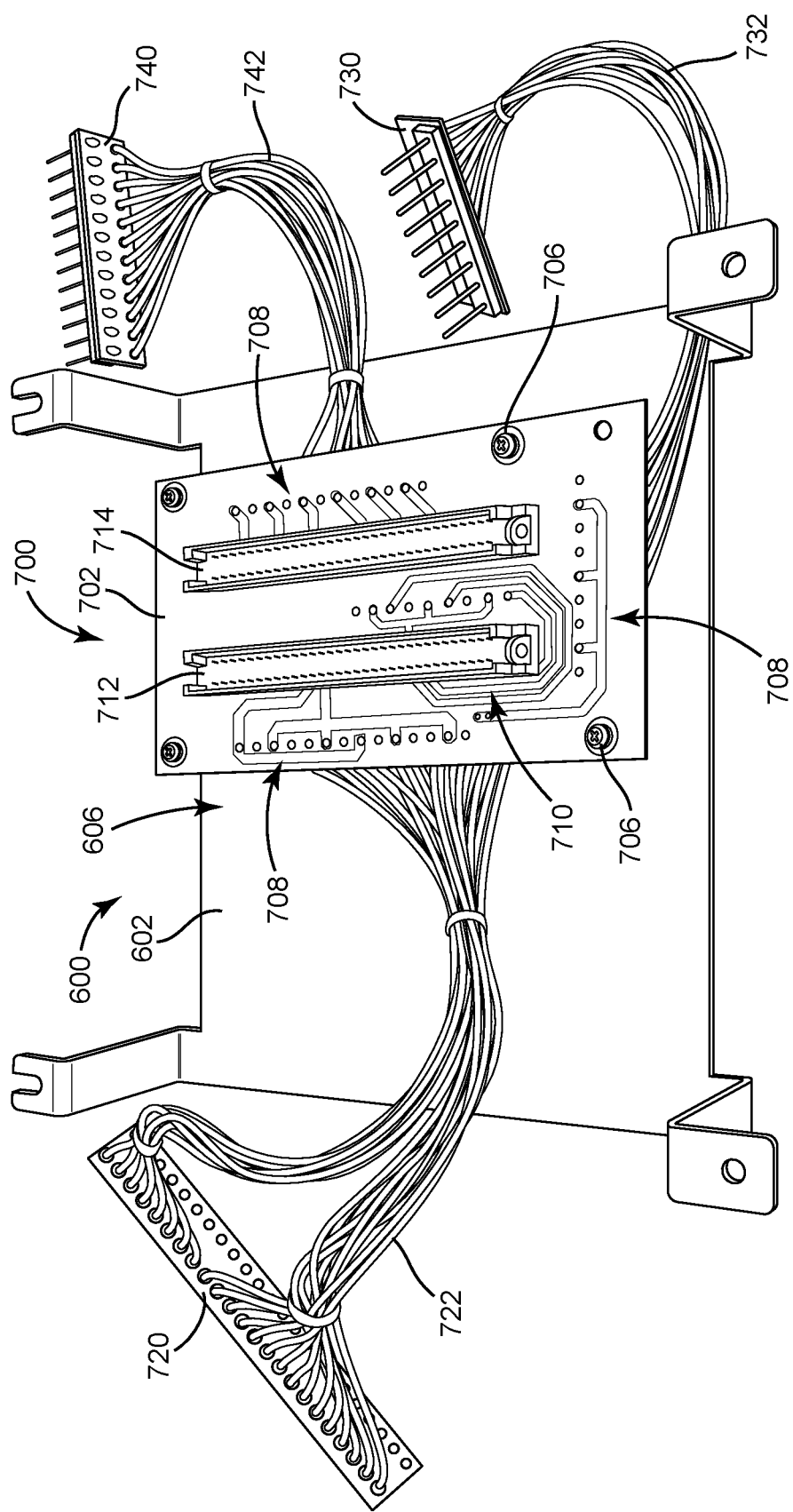
Figure 13:
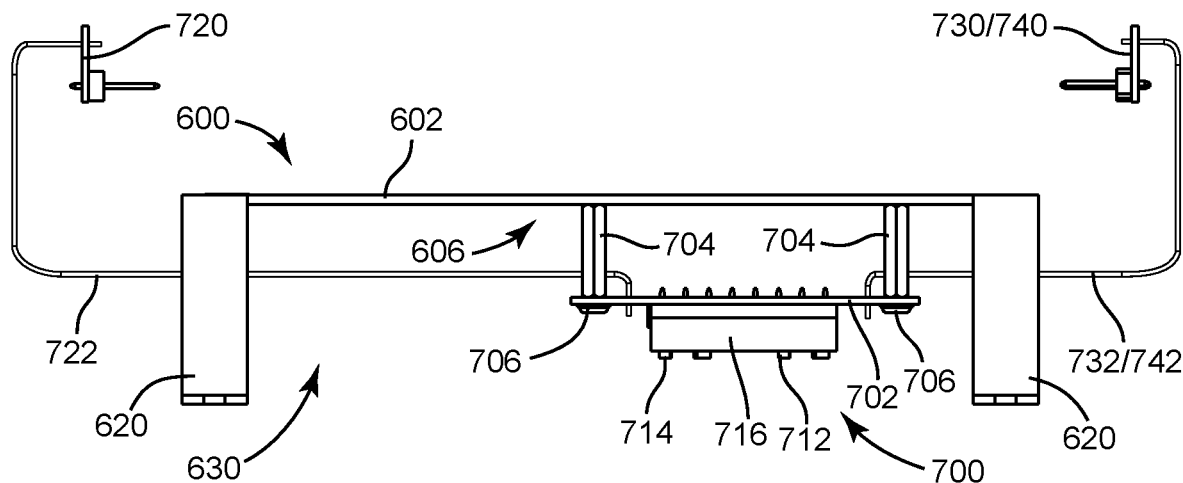

As shown in FIGS. 10-13, the connector assembly 700 includes a first board (e.g., a circuit board, a printed circuit board (PCB), etc.), shown as connector board 702; an interface, shown as connector interface 710; a first connector, shown as first pin connector 720; a second connector, shown as second pin connector 730; and a third connector, shown as third pin connector 740. In other embodiments, the connector assembly 700 includes a different number of connectors (e.g., one, two, four, five, etc.). As shown in FIGS. 10, 12, and 13, the connector board 702 is coupled to the underside 606 of the plate 602 of the adapter bracket 600 with a plurality of fasteners, shown as fasteners 706, that engage with the connector assembly apertures 608. As shown in FIGS. 10 and 13, the connector assembly 700 includes a plurality of spacers, shown as spacers 704, positioned between the connector board 702 and the underside 606 of the plate 602 such that the connector board 702 is spaced from the plate 602. As shown in FIG. 13, the spacers 704 are shorter than the feet 620 of the adapter bracket 600 such the connector board 702 and the components connected thereto are disposed entirely within the recess 630 of the adapter bracket 600.

As shown in FIGS. 10, 12, and 13, the connector interface 710 extends from the connector board 702 away from the plate 602. The connector interface 710 includes a first interface, shown as first connector terminal block 712, and a second interface, shown as second connector terminal block 714. As shown in FIGS. 10 and 13, the connector interface 710 additionally includes a third interface, shown as third connector terminal block 716. In other embodiments, the connector interface 710 includes a different number of terminal blocks (e.g., one, two, four, five, etc.). As shown in FIGS. 10 and 12, the connector board 702 includes a plurality of conductive tracks, shown as conductive tracks 708. As shown in FIGS. 10-13, the first pin connector 720 is coupled to one or more the conductive tracks 708 of the connector board 702 with a first plurality of wires, shown as first wires 722; the second pin connector 730 is coupled to one or more the conductive tracks 708 of the connector board 702 with a second plurality of wires, shown as second wires 732; and the third pin connector 740 is coupled to one or more the conductive tracks 708 of the connector board 702 with a third plurality of wires, shown as third wires 742. In other embodiments, the connector assembly 700 includes a different number of wires (e.g., one, two, four, five, etc.) to correspond with a different number of terminal blocks and/or pin connectors. According to an exemplary embodiment, each of the conductive tracks 708 is electrically coupled to at least one of the first connector terminal block 712, the second connector terminal block 714, and the third connector terminal block 716 of the connector interface 710. The first pin connector 720, the second pin connector 730, and the third pin connector 740 may thereby be electrically coupled to at least one of the first connector terminal block 712, the second connector terminal block 714, and the third connector terminal block 716 of the connector interface 710.

Figure 5:
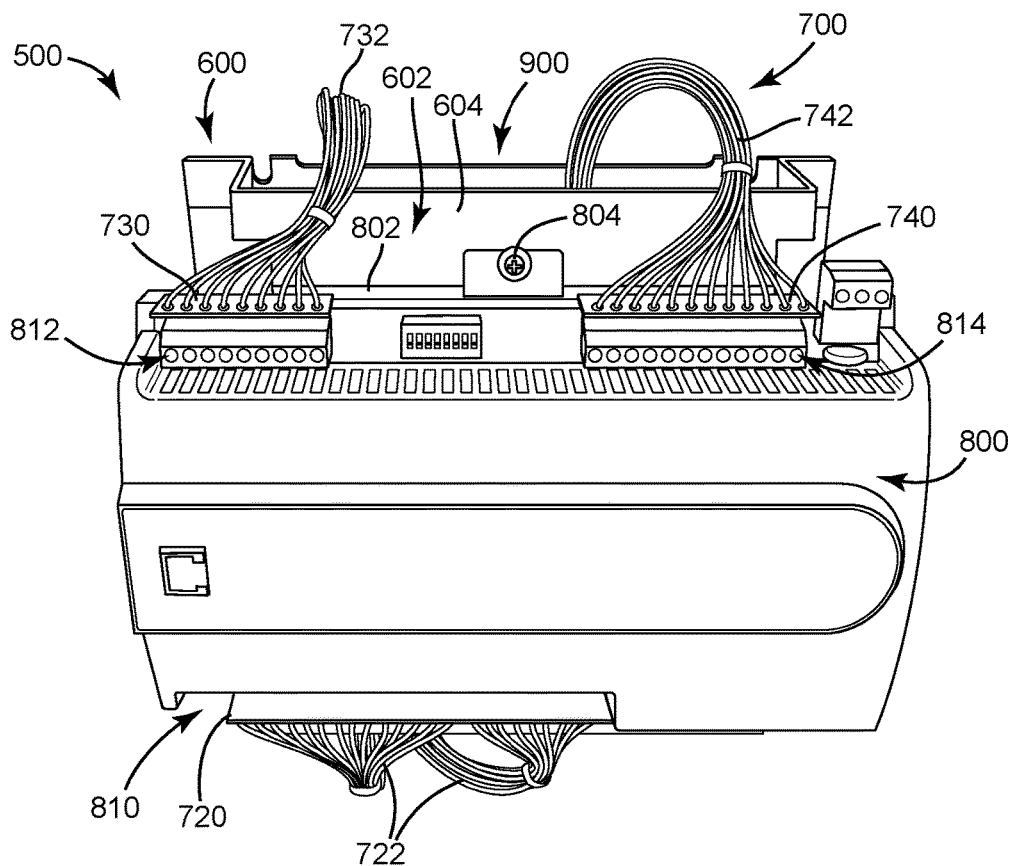
FIG. 5 is a perspective top view of a field controller unit, according to some embodiments.
Figure 6:
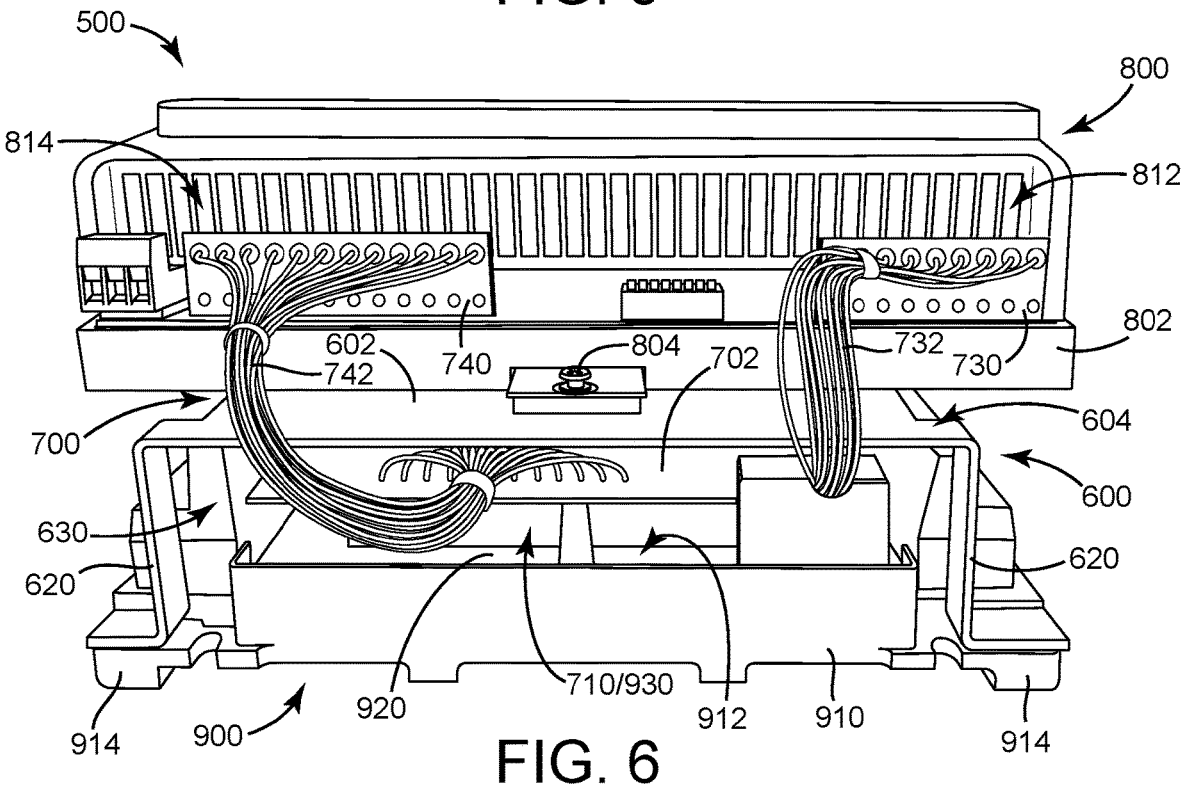
FIG. 6 is a side view of the field controller unit of FIG. 5, according to some embodiments.
Figure 14:
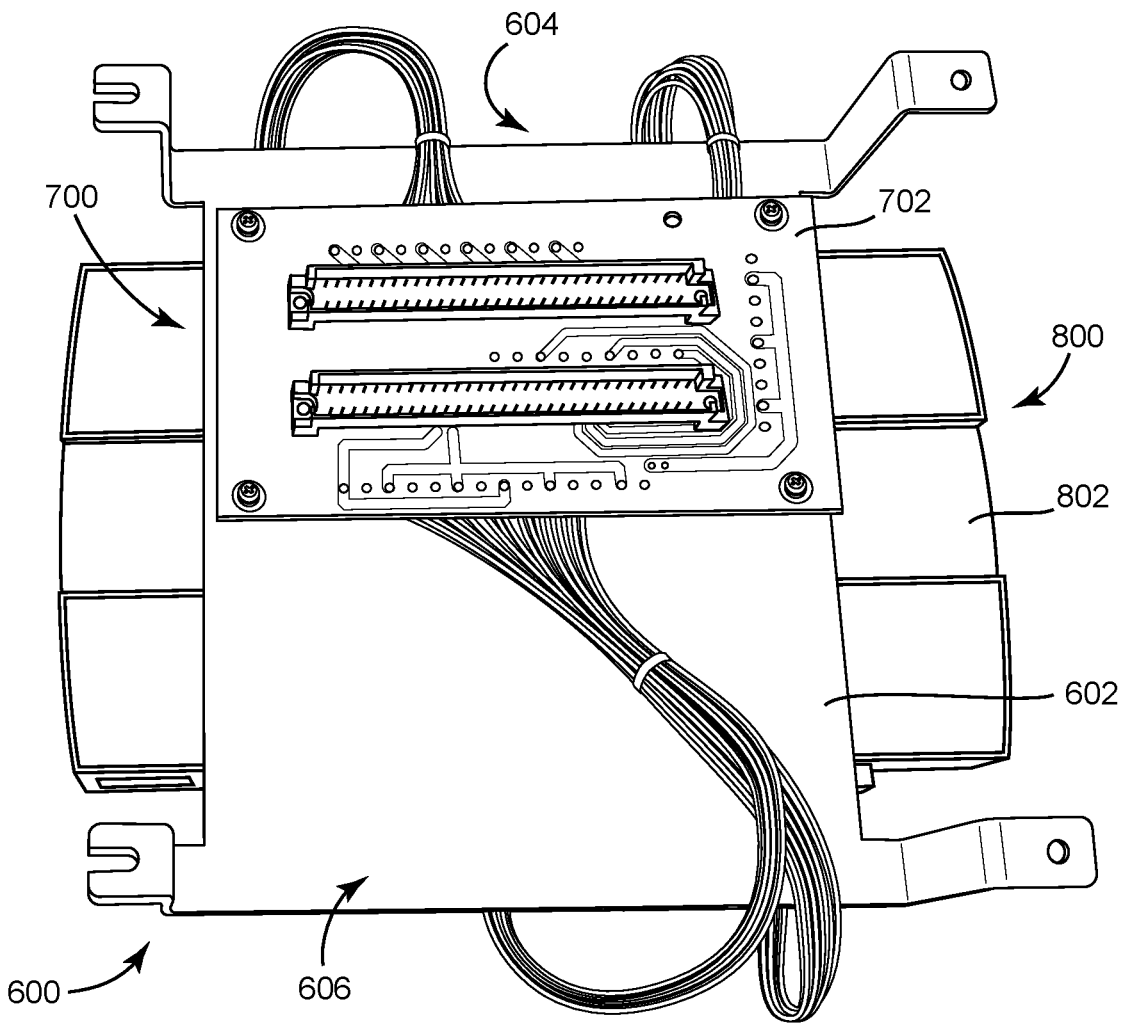
FIG. 14 is a bottom view of a field controller of the field controller unit of FIG. 5 coupled to the adapter bracket of FIGS. 7-9, according to some embodiments.

As shown in FIGS. 5, 6, and 14, the field controller 800 is coupled to the top side 604 of the plate 602 of the adapter bracket 600. The field controller 800 includes a mounting portion, shown as mounting base 802, that receives a plurality of fasteners, shown as fasteners 804. According to an exemplary embodiment, the fasteners 804 engage with the field controller apertures 610 to secure the field controller 800 to the top side 604 of the plate 602 of the adapter bracket 600. As shown in FIGS. 5 and 6, the field controller 800 includes a plurality of interfaces, shown as first interface 810, second interface 812, and third interface 814. According to the exemplary embodiment shown in FIGS. 5 and 6, the first interface 810, the second interface 812, and the third interface 814 are positioned along a peripheral sidewall of the field controller 800.

As shown in FIG. 5, the first interface 810 is configured to interface with and releasably receive the first pin connector 720. As shown in FIGS. 5 and 6, the second interface 812 is configured to interface with and releasably receive the second pin connector 730 and the third interface 814 is configured to interface with and releasably receive the third pin connector 740. According to an exemplary embodiment, (i) the first pin connector 720 and the first wires 722, (ii) the second pin connector 730 and the second wires 732, and (iii) the third pin connector 740 and the third wires 742 electrically couple the first interface 810, the second interface 812, and the third interface 814 of the field controller 800 to the connector board 702, and thereby the first connector terminal block 712, the second connector terminal block 714, and the third connector terminal block 716 of the connector interface 710.

Figure 15:
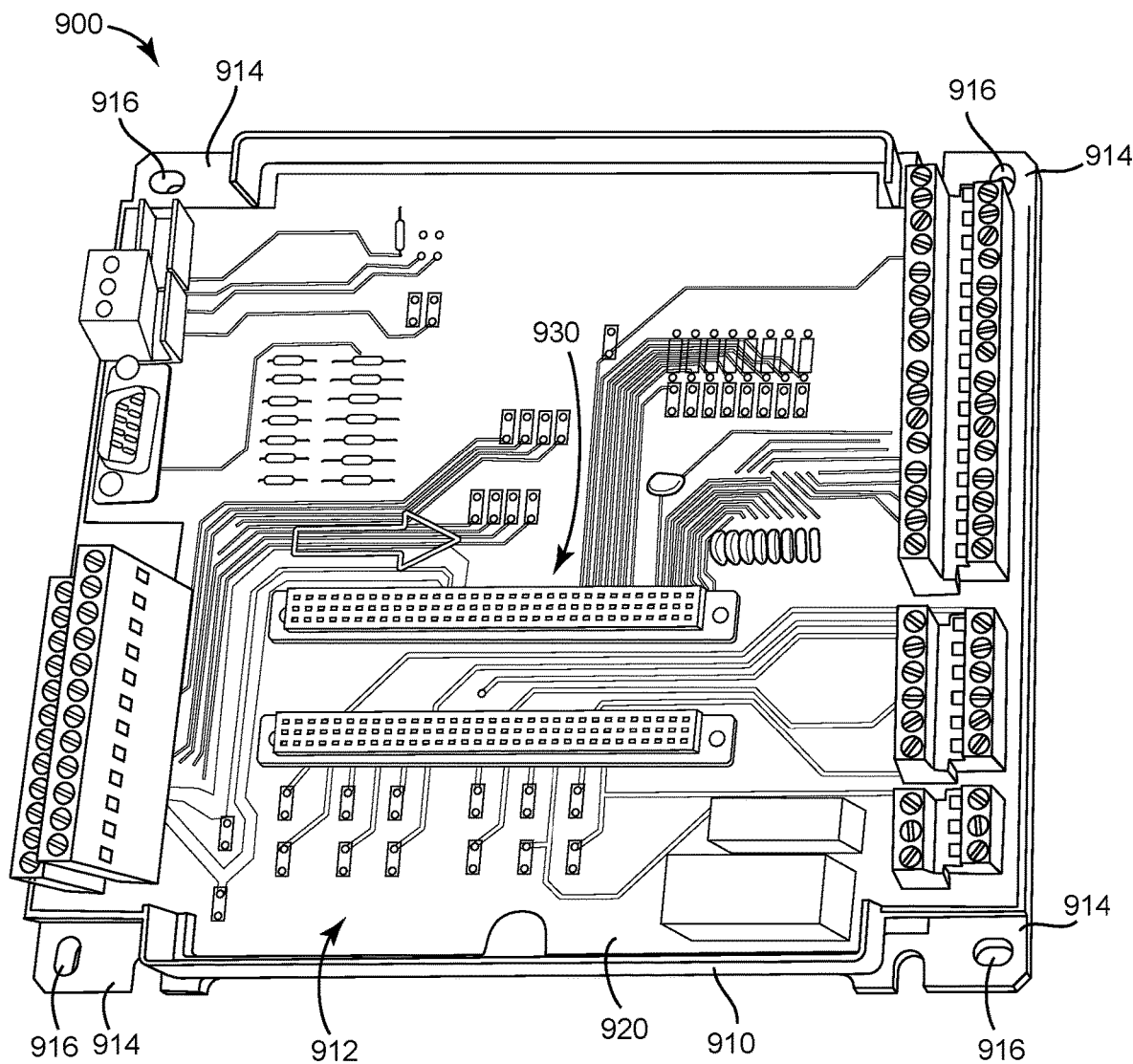
FIG. 15 is a top view of a base of the field controller unit of FIG. 5 including a base housing and a base circuit, according to some embodiments.

As shown in FIGS. 6 and 15, the base 900 includes a housing, shown as base housing 910, and a second board (e.g., a circuit board, a printed circuit board (PCB), etc.), shown as base board 920. The base housing 910 may be configured to couple the field controller unit 500 to a mounting location (e.g., on a control panel within an electrical room, on a respective HVAC component, on a metal base panel in a steel enclosure, etc.). The base housing 910 defines a cavity, shown as board cavity 912, that receives and holds the base board 920. The base housing 910 includes a plurality of mounts, shown mounts 914. As shown in FIG. 15, each of the mounts 914 defines an aperture, shown as mounting aperture 916. As shown in FIG. 6, the feet 620 of the adapter bracket 600 are positioned to align and interface with the mounts 914. According to an exemplary embodiment, the base apertures 622 of the feet 620 and the mounting apertures 916 of the mounts 914 cooperatively receive fasteners to secure the adapter bracket 600 and the field controller 800 to the base housing 910 of the base 900.

Figure 17:
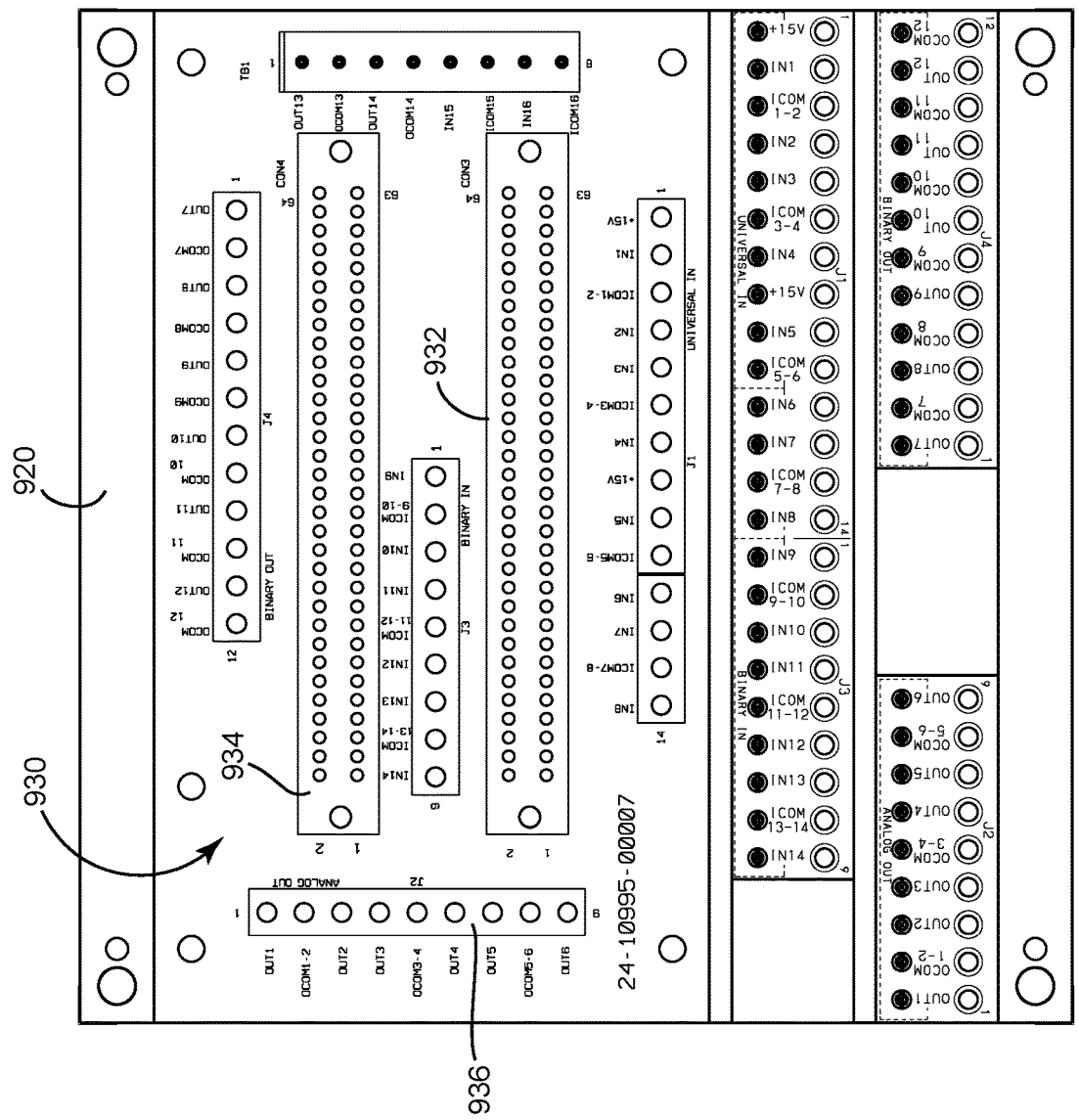
FIGS. 16 and 17 are various views of the base circuit of the base of FIG. 15, according to some embodiments.
Figure 16:
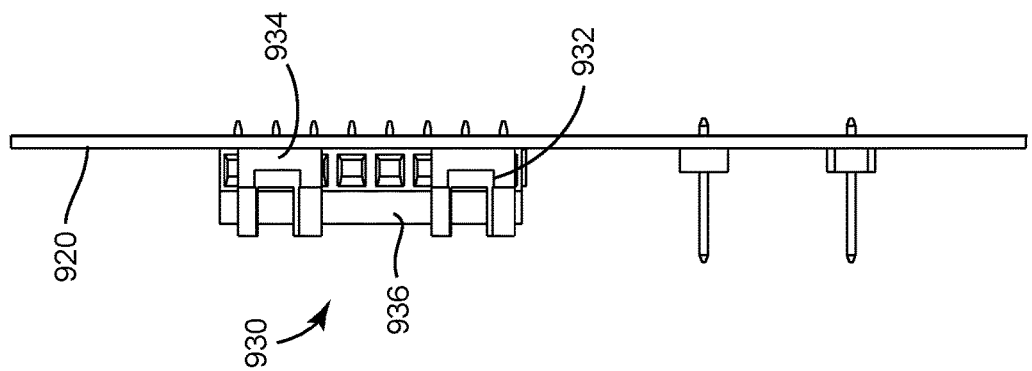

As shown in FIGS. 15-17, the base board 920 includes an interface, shown as base interface 930. As shown in FIGS. 16 and 17, the base interface 930 includes a first interface, shown as first base terminal block 932, a second interface, shown as second base terminal block 934, and a third interface, shown as third base terminal block 936. In other embodiments, the base interface 930 includes a different number of terminal blocks (e.g., one, two, four, five, etc.). As shown in FIG. 6, the base interface 930 is positioned to engage with the connector interface 710 such that the first base terminal block 932 receives the first connector terminal block 712, the second base terminal block 934 receives the second connector terminal block 714, and the third base terminal block 936 receives the third connector terminal block 716 thereby electrically coupling the base board 920 to the connector board 702 and ultimately the field controller 800 (e.g., via the first pin connector 720, the second pin connector 730, the third pin connector 740, etc.).

According to an exemplary embodiment, a method of assembling and installing the field controller unit 500 is as follows. First, an original field controller is detached from the base 900. The original field controller may be recycled or discarded. Second, the field controller 800 (e.g., a new field controller, etc.) having different dimensions than the original field controller is provided with the adapter bracket 600 and the connector assembly 700. Third, the connector assembly 700 is mechanically coupled to the adapter bracket 600 (e.g., to the underside 606 of the plate 602, etc.). Fourth, the field controller 800 is mechanically coupled to the adapter bracket 600 (e.g., to the top side 604 of the plate 602, etc.). Fifth, the field controller 800 is electrically coupled to the connector board 702 of the connector assembly 700 (e.g., the first pin connector 720 and the first wires 722, the second pin connector 730 and the second wires 732, and the third pin connector 740 and the third wires 742 releasably engage with and are received by the first interface 810, the second interface 812, and the third interface 814 of the field controller 800). Sixth, the connector interface 710 of the connector assembly 700 is electrically coupled to the base interface 930 of the base board 910 of the base 900 (e.g., the first base terminal block 932 receives the first connector terminal block 712, the second base terminal block 934 receives the second connector terminal block 714, the third base terminal block 936 receives the third connector terminal block 716, etc.). Lastly, the feet 620 of the adapter bracket 600 are mechanically coupled to the mounts 914 of the base housing 910 of the base 900. In some embodiments, the adapter bracket 600 and the connector assembly 700 are coupled to the base 900 prior to the field controller 800 being coupled to the adapter bracket 600.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

The invention claimed is:

1. A field controller adapter, comprising:
a bracket including a plate having a first side and an opposing second side with a plurality of feet extending from the second side; and
a connector assembly coupled to the second side of the plate, the connector assembly including:
a circuit board;
a terminal block coupled to the circuit board; and
a connector coupled to the circuit board with a plurality of wires;
wherein the first side of the plate is configured to facilitate coupling a field controller thereto;
wherein the connector is configured to electrically couple the field controller to the circuit board;
wherein the plurality of feet are configured to engage with mounts on a housing of a base unit to facilitate mechanically coupling the bracket to the housing; and
wherein the terminal block is configured to engage with a corresponding terminal block on a base circuit board disposed within the housing of the base unit to electrically couple the circuit board to the base circuit board.

2. The field controller adapter of claim 1, wherein the connector assembly further includes a plurality of spacers positioned between the circuit board and the second side of the plate such that the circuit board is spaced from the plate.

3. The field controller adapter of claim 2, wherein the plurality of spacers are shorter than the plurality of feet of the bracket.

4. The field controller adapter of claim 1, wherein the terminal block of the connector assembly includes a plurality of terminal blocks.

5. The field controller adapter of claim 4, wherein the connector of the connector assembly includes a plurality of connectors coupled to the circuit board with a plurality of sets of wires, each of the plurality of sets of wires associated with at least one of the plurality of terminal blocks.

6. The field controller adapter of claim 1, wherein the bracket and the connector assembly are configured to mechanically and electrically couple the field controller to the base unit having a disparate, non-mating structure relative to the field controller.

7. A field controller replacement unit, comprising:
a bracket including a plate having a first side and an opposing second side with a plurality of feet extending from the second side;
a field controller coupled the first side of the plate, the field controller including an interface positioned along a peripheral sidewall thereof; and
a connector assembly coupled to the second side of the plate, the connector assembly including:
a circuit board;
a terminal block coupled to the circuit board; and
a connector coupled to the circuit board with a plurality of wires, wherein the connector is in releasable engagement with the interface of the field controller, electrically coupling the field controller to the circuit board;
wherein the plurality of feet are configured to engage with mounts on a housing of a base unit to facilitate mechanically coupling the bracket to the housing; and
wherein the terminal block is configured to engage with a corresponding terminal block on a base circuit board disposed within the housing of the base unit to electrically couple the circuit board and the field controller to the base circuit board.

8. The field controller replacement unit of claim 7, wherein the connector assembly further includes a plurality of spacers positioned between the circuit board and the second side of the plate such that the circuit board is spaced from the plate.

9. The field controller replacement unit of claim 8, wherein the plurality of spacers are shorter than the plurality of feet of the bracket.

10. The field controller replacement unit of claim 7, wherein the terminal block of the connector assembly includes a plurality of terminal blocks.

11. The field controller replacement unit of claim 10, wherein the connector of the connector assembly includes a plurality of connectors coupled to the circuit board with a plurality of sets of wires, each of the plurality of sets of wires associated with at least one of the plurality of terminal blocks.

12. The field controller replacement unit of claim 11, wherein the interface of the field controller includes a plurality of interfaces positioned along the peripheral sidewall thereof, and wherein each of the plurality of connectors is in releasable engagement with one of the plurality of interfaces of the field controller.

13. The field controller replacement unit of claim 7, wherein the bracket and the connector assembly are configured to mechanically and electrically couple the field controller to the base unit having a disparate, non-mating structure relative to the field controller.

14. A field controller unit, comprising:
a bracket including a plate having a first side and an opposing second side with a plurality of feet extending from the second side;
a field controller coupled the first side of the plate, the field controller including an interface positioned along a peripheral sidewall thereof;
a connector assembly coupled to the second side of the plate, the connector assembly including:
a first circuit board;
a first terminal block coupled to the first circuit board; and
a connector coupled to the first circuit board with a plurality of wires, wherein the connector is in releasable engagement with the interface of the field controller, electrically coupling the field controller to the first circuit board; and a base unit including:

a housing defining a cavity and a plurality of mounts, the plurality of mounts positioned to align with the plurality of feet of the bracket such that the bracket is mechanically couplable to the housing; and a second circuit board disposed within the cavity of the housing, the second circuit board including a second terminal block positioned to align with the first terminal block of the connector assembly such that the second circuit board is electrically couplable to the field controller and the first circuit board.

15. The field controller unit of claim 14, wherein the field controller and the base unit have disparate, non-mating structures.

16. The field controller unit of claim 14, wherein the connector assembly further includes a plurality of spacers positioned between the first circuit board and the second side of the plate such that the first circuit board is spaced from the plate.

17. The field controller unit of claim 16, wherein the plurality of spacers are shorter than the plurality of feet of the bracket.

18. The field controller unit of claim 14, wherein the first terminal block of the connector assembly includes a plurality of first terminal blocks and the second terminal block of the second circuit board includes a plurality of second terminal blocks.

19. The field controller unit of claim 18, wherein the connector of the connector assembly includes a plurality of connectors coupled to the first circuit board with a plurality of sets of wires, each of the plurality of sets of wires associated with at least one of the plurality of first terminal blocks.

20. The field controller unit of claim 19, wherein the interface of the field controller includes a plurality of interfaces positioned along the peripheral sidewall thereof, and wherein each of the plurality of connectors is in releasable engagement with one of the plurality of interfaces of the field controller.

* * * * *